United States Patent

Voorheis et al.

[11] Patent Number: 5,920,188
[45] Date of Patent: Jul. 6, 1999

[54] VOLTAGE MEASUREMENT INSTRUMENT HAVING TRANSIENT OVERVOLTAGE INPUT PROTECTION

[75] Inventors: Howard Temple Voorheis, Everett; William Joseph Lauby, Mukilteo; Michael Floyd Gallavan, Edmonds; Monte Raymond Washburn, Bothell, all of Wash.

[73] Assignee: Fluke Corporation, Everett, Wash.

[21] Appl. No.: 08/978,037

[22] Filed: Nov. 25, 1997

[51] Int. Cl.⁶ ...................................................... G01R 1/04
[52] U.S. Cl. .......................... 324/110; 324/142; 324/156; 220/4.02; 174/52.1
[58] Field of Search .................................... 324/73.1, 110, 324/115, 149, 156, 157; 361/600, 668, 669, 670, 671, 672; 174/50, 52.1; 220/3.92, 3.94, 4.02

[56] References Cited

U.S. PATENT DOCUMENTS

| | | | |
|---|---|---|---|
| 2,930,834 | 3/1960 | Hose | 324/156 |
| 5,084,670 | 1/1992 | Melenotte | 324/156 |
| 5,166,599 | 11/1992 | Hochreuther et al. | 324/110 |
| 5,243,275 | 9/1993 | Nakazawa et al. | 324/110 |
| 5,442,337 | 8/1995 | Hwang | 324/110 |
| 5,625,286 | 4/1997 | Kamiya | 324/156 |

*Primary Examiner*—Diep Do
*Attorney, Agent, or Firm*—George T. Noe

[57] ABSTRACT

A voltage measurement instrument such as a digital multimeter is provided with transient overvoltage input protection. Internal walls are integrally molded with the instrument case and disposed in close proximity to the input receptacles and terminals to separate conductive surfaces and provide transient overvoltage barriers. Top and bottom wall portions are fitted together in tongue-and-groove fashion to increase the creepage and clearance path without increasing the linear distance between conductive surfaces. This arrangement also allows the instrument to maintain a low profile.

2 Claims, 2 Drawing Sheets

VOLTAGE MEASUREMENT INSTRUMENT HAVING TRANSIENT OVERVOLTAGE INPUT PROTECTION

BACKGROUND OF THE INVENTION

This invention relates generally to overvoltage input protection for voltage measurement instruments, and in particular to hand-held digital multimeters having transient overvoltage input protection.

A number of international standards have been implemented to govern safe use of electronic test equipment. To sell products in many markets, the products must conform to the standards, that is, the products must be in compliance with the essential requirements of such standards.

One such international safety standard is the International Electrotechnical Commission pilot standard (IEC) 644-1 (1992) entitled "Insulation Co-ordination For Equipment Within Low-Voltage Systems." Derived from IEC 644-1 is the product standard, IEC-1010, which uses the concept of overvoltage categories (CAT I–CAT IV) in setting forth the requirements of protection from overvoltage transients that may appear at the inputs of electronic measurement apparatus while a voltage source is being measured. Overvoltage transients usually are randomly-occurring, abnormally high voltage spikes or pulses that may last from a few nanoseconds in duration to a few milliseconds. Those contemplated by IEC-1010 are modeled by a pulse having a risetime of 1.2 microseconds, with a decay time, to 50% of peak, of 50 microseconds, and are designated as 1.2×50 $\mu$sec pulses. Such overvoltage transients may be introduced from lightning strikes, high-voltage switching circuits effecting the source, ac power faults, or electrostatic discharge.

Overvoltage categories are used to differentiate locations based upon the probability that an overvoltage transient can cause a hazard. CAT IV is the utility feed, CAT III is the main distribution system, CAT ii is the plugs in the wall, and CAT I is controlled energy circuits. CAT III circuits represent the most hazardous since common test equipment is used in these circuits. CAT III circuits can provide substantial amounts of energy. If the measurement apparatus is a hand-held digital multimeter (DMM) designed for measuring voltages and other electrical phenomena, the result of an arc occurring inside the DMM with follow-through energy added can be catastrophic and/or injurious. Thus, the risk associated with CAT III circuits can be great.

The IEC-1010 standard provides for spacing requirements between conductive surfaces for a given maximum input voltage rating, pollution degree, and overvoltage category. These spacings are referred to as "creepage" distances along surfaces and "clearance" distances from point to point through air. Of course, larger distances enable electronic measurement instruments to withstand higher-rated voltages and some of the higher overvoltage transients that may be found on a system being measured.

Hand-held DMMs are typically small and compact, and voltage input terminals are necessarily physically located a short distance from one another. It would be desirable to provide a voltage measurement instrument having the highest transient overvoltage input protection attainable without adding complexity, bulk, or cost.

SUMMARY OF THE INVENTION

In accordance with the present invention, a voltage measurement instrument such as a digital multimeter is provided with transient overvoltage input protection. Internal walls are integrally molded with the instrument case and disposed in close proximity to the input receptacles and terminals to separate conductive surfaces and provide transient overvoltage barriers. Top and bottom wall portions are fitted together in tongue-and-groove fashion to increase the creepage and clearance path without increasing the linear distance between conductive surfaces. This arrangement also allows the instrument to maintain a low profile.

It is therefore one object of the present invention to provide transient overvoltage input protection in a voltage measurement instrument.

It is another object to provide overvoltage barrier walls between conductive surfaces in a hand-held digital multimeter wherein the creepage and clearance path is lengthened without increasing the linear distances between such conductive surfaces.

It is a further object to provide a hand-held digital multimeter that meets international safety standard IEC-1010 without increase increasing bulk, size, or complexity.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
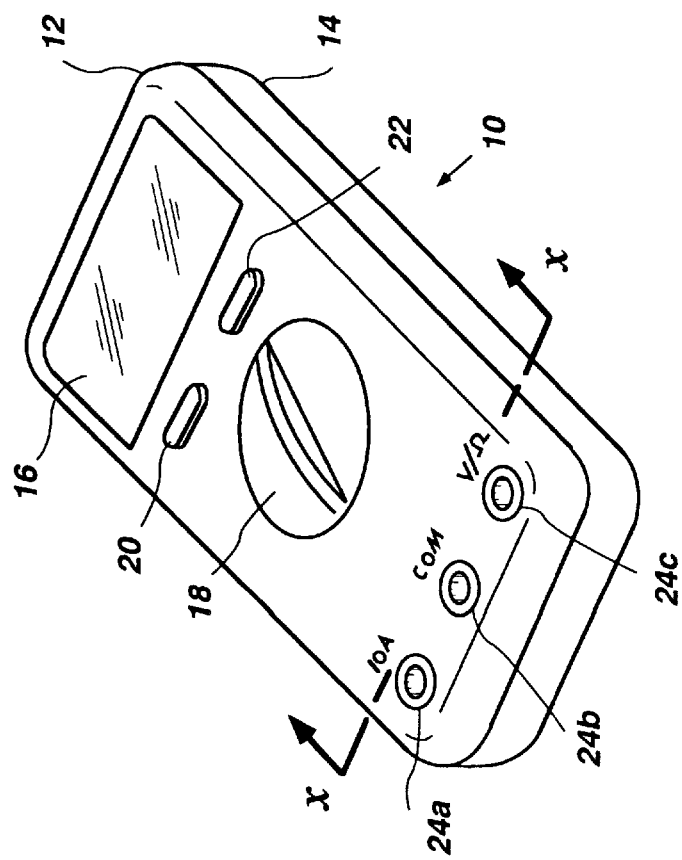
FIG. 1 is a perspective view of a digital multimeter incorporating the present invention.

Referring to FIG. 1 of the drawings, there is shown a perspective view of a digital multimeter 10 having overvoltage protection in accordance with the present invention. Multimeter 10 has a top case portion 12 and a bottom case portion 14 molded of a suitable plastic material to provide a housing for electronic measurement circuitry. Multimeter 10 also has a clear plastic lens or faceplate 16 to permit viewing alpha-numeric characters on a liquid crystal display (LCD), a rotary function selector knob 18, operating mode switch pushbuttons 20 and 22, and input receptacles 24a, 24b, and 24c arranged in a row.

It is in the area of the input receptacles that attention will be focused in this description. Receptacle 24a may, for example, be a 10-ampere (10 A) input receptacle. Similarly, receptacle 24b may be a ground or common input (COM), and receptacle 24c may be a voltage and resistance (Volts/Ohms) input.

To facilitate understanding the invention and comparison of illustrations, like elements have like reference numerals in all of the drawing figures.

Figure 2:
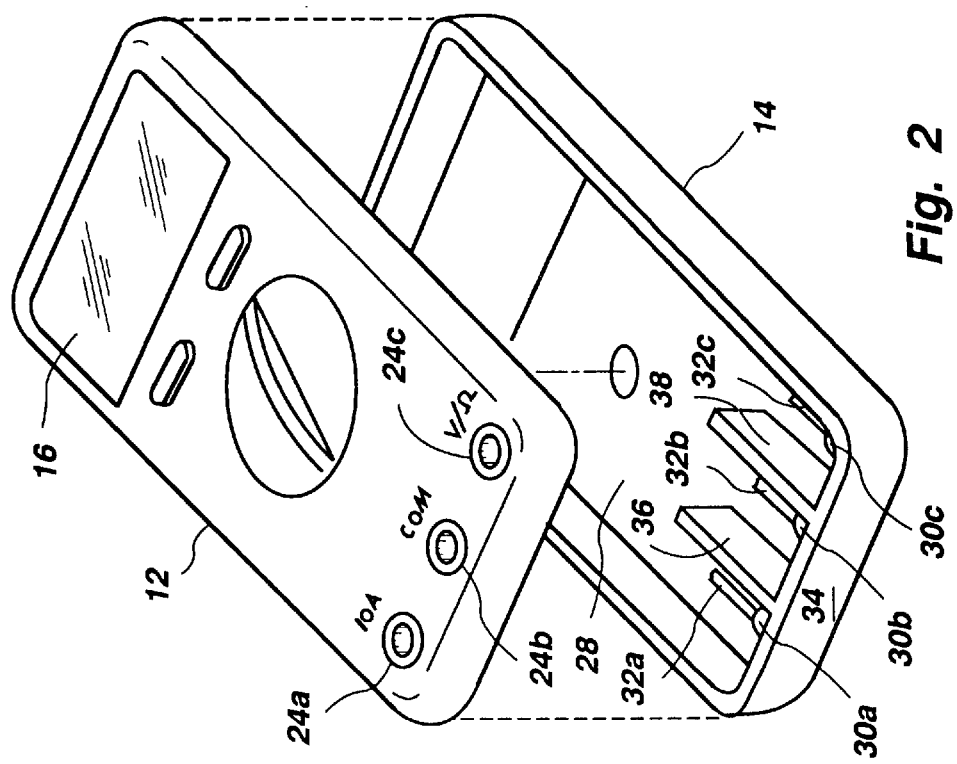
FIG. 2 is an exploded perspective view of a digital multimeter incorporating the present invention.

FIG. 2 is an exploded perspective view of the digital multimeter of FIG. 1 with the top case portion 12 and bottom case portion 14 separated to show internal details of the multimeter housing. A circuit board 28 carrying the electronic measurement circuitry (not shown) is seated inside the bottom case portion 14. The input receptacles 24a, 24b, and 24c mate with and are electrically connected to contacts or terminals 30a, 30b, and 30c. Accordingly, terminals 30a, 30b, and 30c may be associated with high current, ground and high voltages, respectively. Extending away from terminals 30a, 30b, and 30c toward the electronic measurement circuitry are circuit traces or conductors 32a, 32b, and 32c.

Integrally molded with the bottom of bottom case portion 14 and an end wall 34 thereof, and extending away therefrom along at least a portion of the length of circuit traces 32a–c are overvoltage barrier walls 36 and 38 which separate and isolate the terminals 30a–c and conductors 32a–c. Walls 36 and 38 may be molded of the same plastic as that used on the top and bottom case portions 12 and 14, and are of sufficient thickness to provide an isolation barrier between the conductive surfaces of respective terminals 30a–30c/conductors 32a–32c. It should be noted that similar walls are molded integrally with the top case portion 12, as well, and mate with the walls 36 and 38 when the top and bottom case portions 12 and 14 are joined together, as shown in FIGS. 3A and 3B.

Figure 3A:
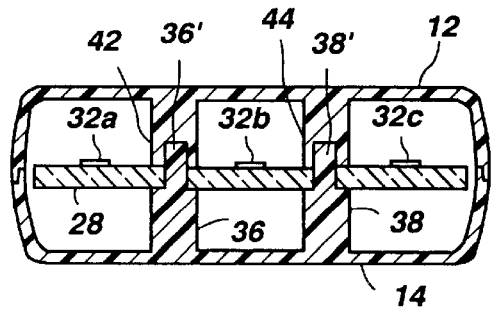
FIG. 3A is a cross-sectional view of the digital multimeter of FIG. 1 in accordance with one embodiment of the present invention.

FIG. 3A is a cross-sectional view of the digital multimeter of FIG. 1 in accordance with one embodiment of the present invention, taken along the lines of x—x and looking into the multimeter body. Lower barrier walls 36 and 38 extend upward from the bottom case portion 14, and mate in tongue-and-groove fashion, so as to provide a non-linear or circuitous creepage path, with upper barrier walls 42 and 44, respectively, extending downward from the top case portion 12, capturing circuit board 28 therebetween. Lower walls 36 and 38 each have shoulders upon which the circuit board 28 rests, and include a tongue portion 36', 38' which extends upward into a groove provided in each of upper walls 42 and 44. The assembly fits together with close tolerances to minimize any air gaps which may provide an arc path for overvoltage transients.

Figure 3B:
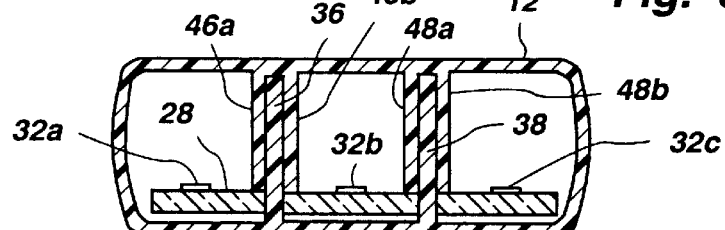
FIG. 3B is a cross-sectional view of the digital multimeter of FIG. 1 in accordance with a second embodiment of the present invention.

FIG. 3B is a cross-sectional view of the digital multimeter of FIG. 1 in accordance with a second embodiment of the present invention, taken along the lines of x—x and looking into the multimeter body. In this embodiment, lower barrier walls 36 and 38 extend upward from the bottom case portion 14 through slots in circuit board 28, which rests on the bottom case portion 14. Parallel upper barrier walls 46a, 46b and 48a, 48b extend downward from the top case portion 12, capturing lower wall 36 between upper walls 46a and 46b, and lower wall 38 between upper walls 48a and 48b. This assembly, like that of FIG. 3A, fits together with close tolerances to minimize any air gaps which may provide an arc path for overvoltage transients. As mentioned earlier, the spacings between conductors are referred to in international safety standard IEC-1010 as "creepage" distances along surfaces and "clearance" distances from point to point through air. By inspection, it can be seen the creepage path provided by this embodiment is longer than that of the embodiment of FIG. 3A.

Figure 4:
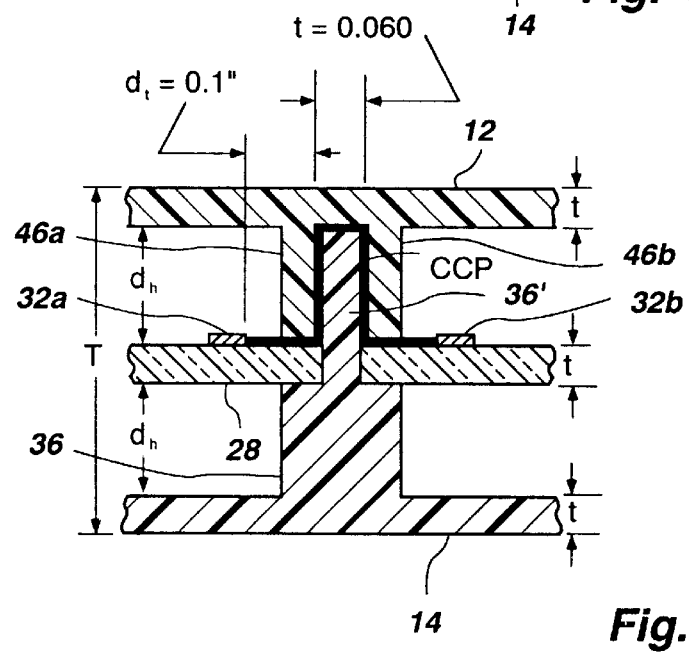
FIG. 4 is a cross-sectional view of one overvoltage-barrier wall showing the creepage and clearance path.

Referring to FIG. 4, which is a cross-sectional view of one overvoltage-barrier wall comprising a lower wall 38 and an upper wall 46a, 46b separating two conductors 32a and 32b, the dimensions of the creepage and clearance path (CCP) may be calculated from information given in the international safety standard IEC-1010. Table 1 shows the total creepage and clearance path in millimeters for 15 kilovolt and 20 kilovolt ratings for 50/60 Hertz sine waves, 1.2×50 microsecond pulses, and as combination of both.

TABLE 1

| CCP | 15 kV | 20 kV |
| --- | --- | --- |
| 50/60 Hz Sine | 24.42 | 34.2 |
| 1.2 × 50 μsec Impulse | 18.0 | 25.15 |

The creepage and clearance path is shown in FIG. 4 as a heavy line CCP connecting conductors 32a and 32b through a non-linear, circuitous path around the tongue portion 36' of lower wall 36 which is enclosed by upper walls 46a and 46b. The circuitous nature of CCP within the wall separating conductors 32a and 32b allows conductors 32a and 32b to be much closer together than would otherwise be permissible. Let the dimension t, which is the thickness of the tongue portion 36' of wall 36, be equal to 0.060 inch (1.524 mm), and the dimension $d_t$ be equal 0.1 inch (2.54 mm). This is the distance from conductor 32a to tongue portion 36' or from conductor 32b to tongue portion 36'. The dimension $d_h$ for the height of the tongue portion 36' may be calculated from the length of CCP minus the other distances in the path. That is, $2d_h=CCP-(t+2d_t)$ because $CCP=t+2d_t+2d_h$. For a minimum creepage and clearance path of 34.2 millimeters for a 20 kV rating from Table 1, $d_h$=13.8 mm, or 0.543 inch. For a minimum creepage and clearance path of 24.42 millimeters for a 15 kV rating from Table 1, $d_h$=8.91 mm, or 0.351 inch.

The total wall thickness must be large enough to serve as a solid dielectric between conductors (e.g., between conductors 32a and 32b) such that there can be no arcing through the wall (i.e., tongue portion 36' in combination with upper walls 46a and 46b as shown in FIG. 4).

One large advantage of the non-linear or circuitous creepage and clearance path can now be readily understood in terms of linear spacing. That is, for a 20 kV rating, for example, conductors 32a and 32b physically may be spaced about 6.6 millimeters apart while the rated creepage and clearance path between these conductors is 34.2 millimeters in the example given above.

With all of the dimensions and distances known from the foregoing calculations, total thickness T for the multimeter shown in FIG. 4 can be calculated as well. Assume, for example, the thickness of the upper case portion 12, lower case portion 14, and circuit board 28 are all 0.060 inch. Then, from $T=2d_h+3t$, total thickness T is a minimum of 32.172 mm (1.267 inch) for a 20 kV rating, and a minimum of 22.392 mm (0.8816 inch) for a 15 kV rating. The dimensions used herein are for illustrative purposes only, and any dimensions may be used so long as the minimum creepage and clearance paths for conditions set forth in Table 1 are met.

Figure 5:
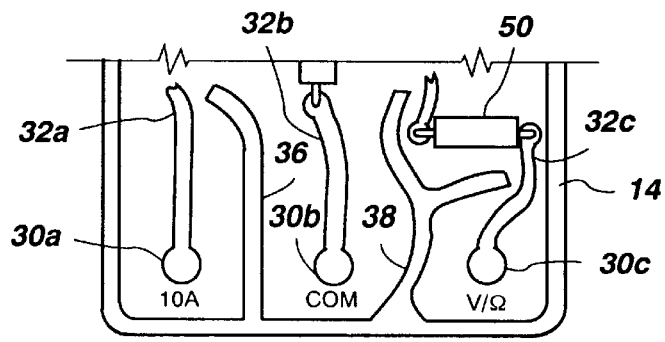
FIG. 5 is a plan view of an alternative configuration wherein the overvoltage-barrier walls are shaped to conform to the layout of voltage potentials or circuit components.

The overvoltage-barrier walls need not be of uniform thickness and may be curved or adapted to conform to the shape of the layout of voltage potentials or circuit components. FIG. 5 is a plan view of the bottom case portion 14 in an alternative configuration wherein the overvoltage-barrier walls are shaped to conform as desired. Note that lower wall 38 is bifurcated to provide a partial enclosure of a fuse resistor 50.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. A voltage measurement instrument having transient overvoltage input protection, comprising:

a top case portion and a bottom case portion which are joined together to provide an instrument housing;

a circuit board disposed in said housing;

at least two input receptacles disposed in said housing and having terminals electrically connected to conductors on said circuit board; and a barrier wall disposed between said input receptacles and extending along said conductors, said barrier wall formed of an upper wall and a lower wall joined so as to provide a circuitous creepage and clearance path therebetween.

2. A voltage measurement instrument in accordance with claim 1 wherein said upper wall and said lower wall are formed integrally with said top case portion and said bottom case portion, respectively.

* * * * *